United States Patent
Lian et al.

(10) Patent No.: US 7,952,878 B2
(45) Date of Patent: May 31, 2011

(54) HEAT DISSIPATION DEVICE

(75) Inventors: Zhi-Sheng Lian, Shenzhen (CN); Gen-Ping Deng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/577,736

(22) Filed: Oct. 13, 2009

(65) Prior Publication Data

US 2011/0032675 A1    Feb. 10, 2011

(30) Foreign Application Priority Data

Aug. 10, 2009 (CN) .......................... 2009 1 0305420

(51) Int. Cl.
*H05K 7/20* (2006.01)

(52) U.S. Cl. ... 361/700; 361/695; 361/699; 165/104.33; 174/15.2; 257/715; 257/719

(58) Field of Classification Search .................. None
See application file for complete search history.

(56) References Cited

U.S. PATENT DOCUMENTS

| 7,380,585 | B2 * | 6/2008 | Liu et al. ................... 165/104.33 |
| 7,388,747 | B2 * | 6/2008 | Yang et al. ..................... 361/700 |
| 7,414,850 | B2 * | 8/2008 | Hung ........................... 361/719 |
| 7,447,030 | B2 * | 11/2008 | Hwang et al. .................. 361/700 |
| 7,606,036 | B2 * | 10/2009 | Hwang et al. ................. 361/719 |
| 7,697,298 | B2 * | 4/2010 | Chen ............................ 361/719 |
| 7,742,295 | B2 * | 6/2010 | Hata et al. ................ 361/679.47 |
| 7,808,782 | B2 * | 10/2010 | Luo .............................. 361/700 |
| 2008/0105410 | A1 * | 5/2008 | Hwang et al. ............ 165/104.33 |
| 2010/0258277 | A1 * | 10/2010 | Chen et al. ............... 165/104.26 |

\* cited by examiner

*Primary Examiner* — Boris L Chervinsky
(74) *Attorney, Agent, or Firm* — Frank R. Niranjan

(57) ABSTRACT

A heat dissipation device for dissipating heat generated by a heat-generating component mounted on a printed circuit board, includes a heat absorbing board with a bottom thereof attached to the heat-generating component, two heat sinks, two heat pipes respectively connecting the heat absorbing board and the two heat sinks, two centrifugal fans and two clips. Each of the centrifugal fans is located at a lateral side of a corresponding heat sink. Each of the clips includes an engaging portion riveting with the heat absorbing board and two locking portions extending from two ends of the engaging portion and locked onto the printed circuit board to thereby secure the heat absorbing board on the heat-generating component.

12 Claims, 3 Drawing Sheets

HEAT DISSIPATION DEVICE

BACKGROUND

1. Technical Field

The present disclosure relates generally to a heat dissipation device, and more particularly to a heat dissipation device for dissipating heat generated by a heat-generating component in an electronic device.

2. Description of Related Art

Generally, in order to ensure the normal running of an electronic device, a heat dissipation device is used to dissipate heat generated by the electronic device. The heat dissipation is more important in a thin type device, such as a notebook or an All In One (AIO), since it has a relatively small volume, whereby heat is easily accumulated therein.

A typical heat dissipation device includes a heat absorbing board, a mounting plate, a heat pipe, a heat sink and a fan. Specifically, the heat absorbing board is attached to a heat generating component such as a CPU. The mounting plate fixes the heat absorbing board onto the heat generating component. The heat pipe connects the heat absorbing board and the heat sink and transfers the heat absorbed by the heat absorbing board to the heat sink. The fan generates cooling air to dissipate heat in the heat sink. However, in such a heat dissipation device, the mounting plate has a complicated structure which is difficult to manufacture and thus a manufacturing cost of the heat dissipation device is high.

What is need therefore is a heat dissipation device which can overcome the limitation described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
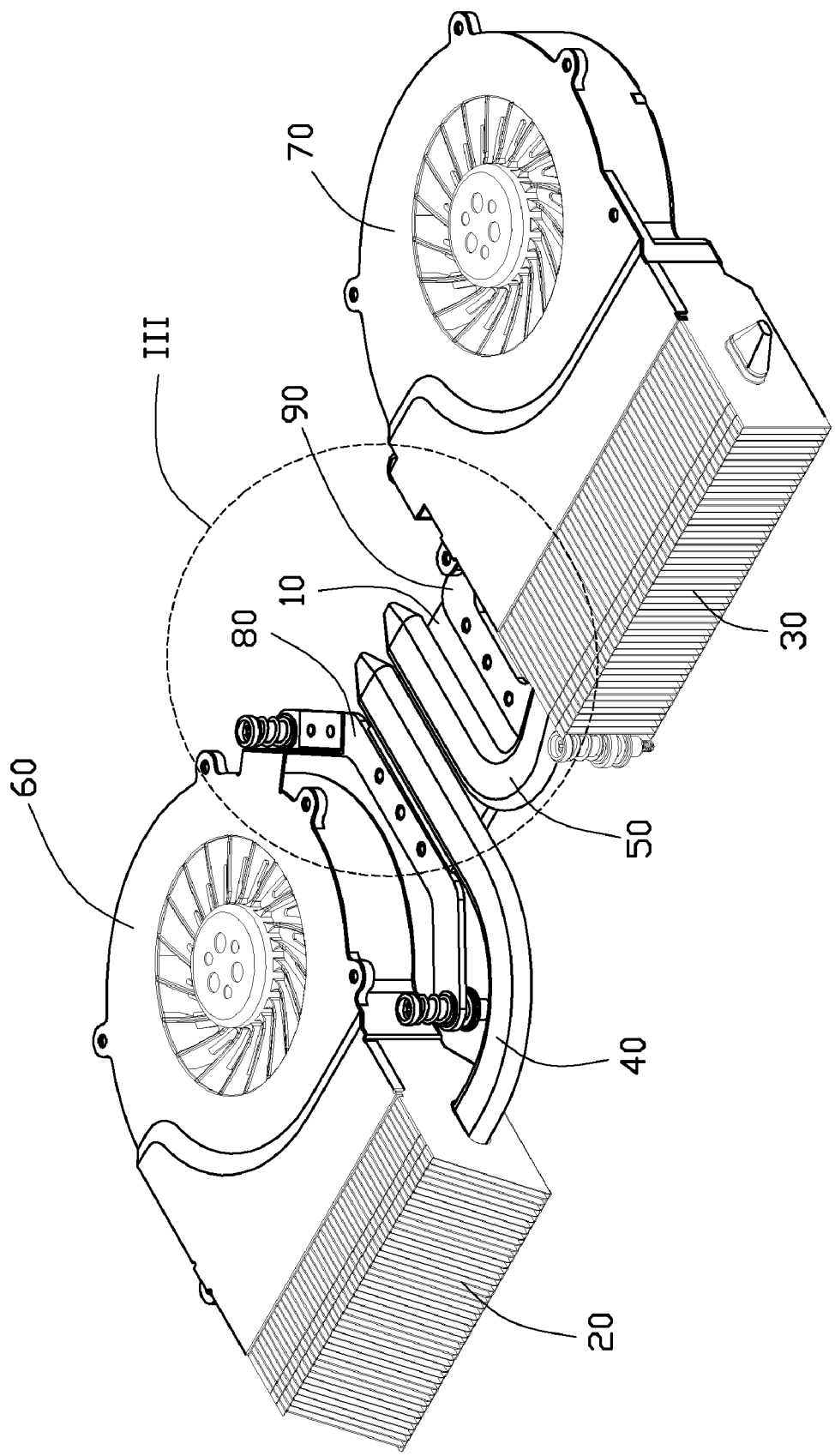
FIG. 1 is an isometric, assembled view of a heat dissipation device in accordance with an embodiment of the present disclosure.
Figure 2:
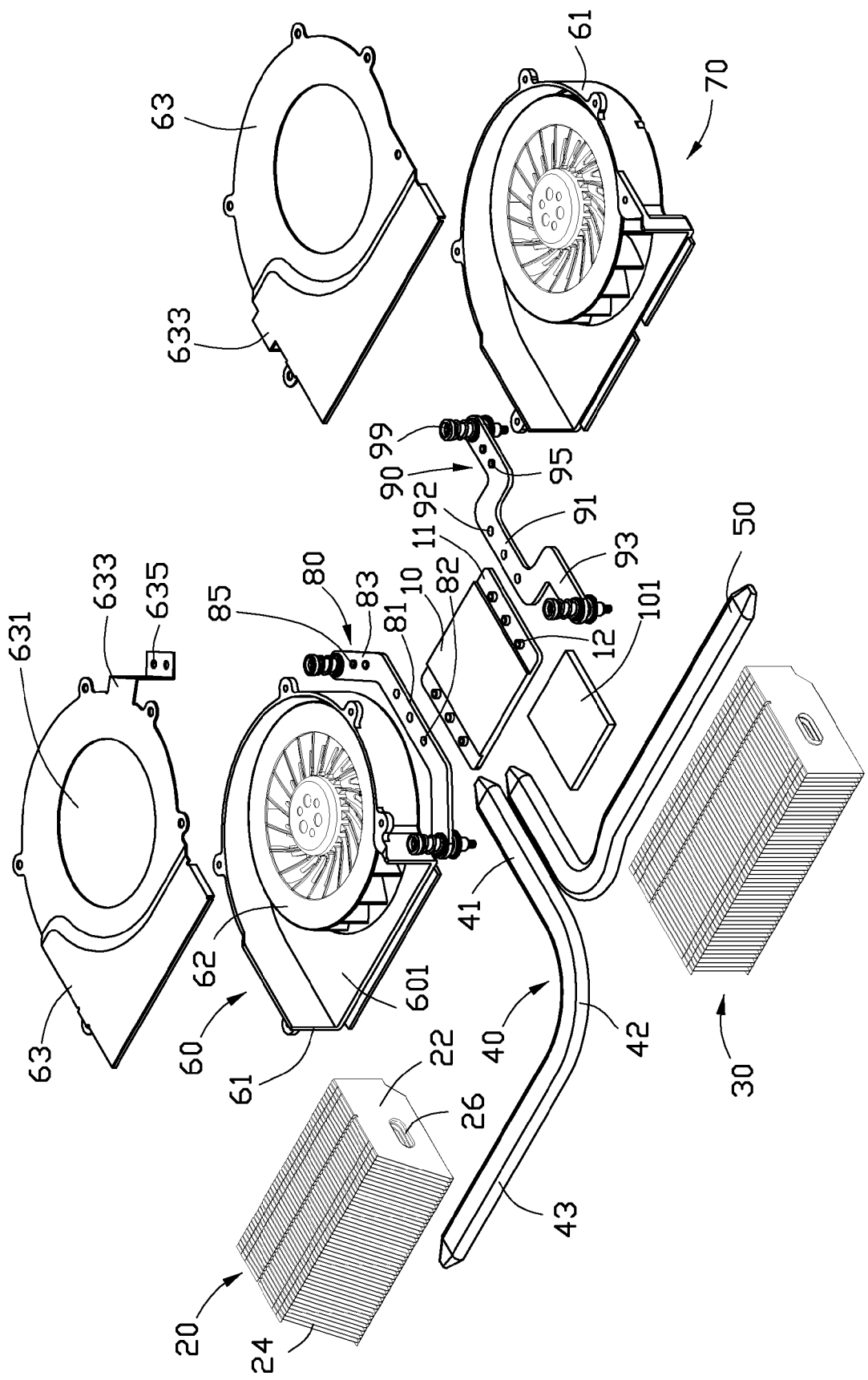
FIG. 2 is an exploded view of the heat dissipation device of FIG. 1.
Figure 3:
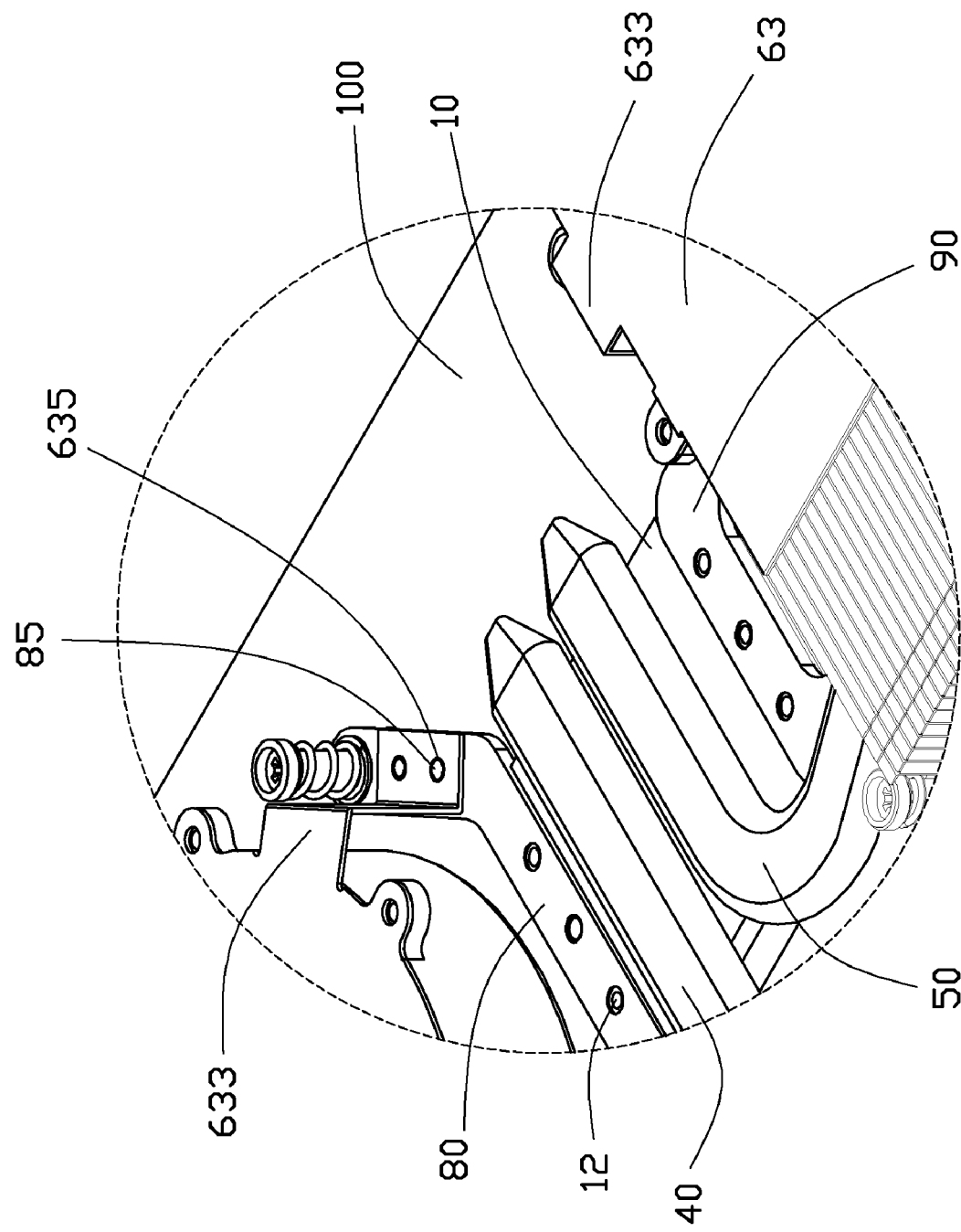
FIG. 3 is a partially enlarged view of the heat dissipation device of FIG. 1 mounted onto a printed circuit board.

FIGS. 1-3 illustrate a heat dissipation device in accordance with an embodiment of the present disclosure. The heat dissipation device dissipates heat from a heat-generating component 101 such as a CPU mounted on a printed circuit board 100. The heat dissipation device comprises a heat absorbing board 10 attached to the heat-generating component 101, a first heat sink 20 and a second heat sink 30, a first heat pipe 40 connecting the heat absorbing board 10 and the first heat sink 20, a second heat pipe 50 connecting the heat absorbing board 10 and the second heat sink 30, a first centrifugal fan 60 located at a rear side of the first heat sink 20, a second centrifugal fan 70 located at a rear side of the second heat sink 30, and first and second clips 80, 90. The first and second clips 80, 90 are fixed onto the heat absorbing board 10 and adapted for securing the heat absorbing board 10 on the printed circuit board 100 to insure an intimate attachment of the heat absorbing board 10 and the heat-generating component 101.

The heat absorbing board 10 is substantially a rectangular plate and made of a material with high heat conductivity such as copper or aluminum. A bottom of the heat absorbing board 10 is attached to the heat-generating component 101. Two lateral sides of the heat absorbing board 10 are depressed downwardly to form two steps 11 thereon. A plurality of columned studs 12 extend upwardly from each of the steps 11. In this embodiment, the columned studs 12 have a number of three. The studs 12 are integrally formed on the step 11 by punching. Thus, a concave (not shown) is defined in the bottom of the heat absorbing board 10 corresponding to each stud 12.

The first heat sink 20 and the second heat sink 30 have similar structures and each comprise a plurality of parallel and vertical fins 22. A plurality of vertical channels 24 are defined between the fins 22. An opening (not labeled) is defined in the middle of each fin 12. The openings cooperatively define a receiving passage 26 to receive the heat pipe 40 (50).

The first heat pipe 40 and the second heat pipe 50 are similar to each other and both have a substantially L-shaped configuration. Each of the first and second heat pipes 40, 50 comprises an evaporating section 41 attached to the top of the heat absorbing board 10, a condensing section 43 received in the passage 26 of the heat sink 20 (30) and a bent middle section 42 interconnecting the evaporating section 41 and the condensing section 43.

The first and second centrifugal fans 60, 70 are similar to each other and each comprise a frame and an impeller 62 rotatably received in the frame. The frame comprises a base 61 and a cover 63 covering the base 61. A round air inlet 631 is defined in a middle of a top of the cover 63. A fastening plate 633 extends downwardly from a lateral edge of the cover 63. Two holes 635 are defined in a free end of the fastening plate 633. A straight air outlet 601 is defined at a front side of the frame and enclosed by the base 61 and the cover 63. The air outlet 601 is positioned corresponding to the channels 24 of the heat sink 20 (30). The air generated by the centrifugal fan 60 (70) flows through the air outlet 601 into the channels 24.

The first clip 80 comprises a straight engaging portion 81 and two straight locking portions 83 bent from two opposite ends of the engaging portion 81. The locking portions 83 each are shorter than the engaging portion 81. The locking portions 83 are symmetric relative to the engaging portion 81. Three apertures 82 are defined in the engaging portion 81 corresponding to the studs 12 of the heat absorbing board 10. The studs 12 can be inserted into the apertures 82 to thereby rivet the heat absorbing board 10 and the engaging portion 81 of the first clip 80 together. Two columned pins 85 protrude upwardly from one of the locking portions 83 to match the holes 635 of the fastening plate 633 of the first centrifugal fan 60. The pins 85 can be inserted into the holes 635 to thereby rivet the one of the locking portions 83 of the first clip 80 and the first centrifugal fan 60 together. Understandably, the numbers of the holes 635 and the pins 85 can be varied in alternative embodiments.

The second clip 90 comprises a straight engaging portion 91 and two locking portions 92 bent from two opposite ends of the engaging portion 91. The locking portions 92 are L shape and symmetrical to the engaging portion 91. Similar to the first clip 80, three apertures 92 are defined in the engaging portion 91 corresponding to the studs 12 of the heat absorbing board 10, and two columned pins 95 protrude upwardly from one of the locking portions 93 to correspond to the holes 635 of the fastening plate 633 of the second centrifugal fan 70. A fastener 99 inserts through a free end of each of the locking portions 83, 93 of the first and second clips 80, 90. The fastener 99 is used for locking onto the printed circuit board 100 to thereby fix the first and second clips 80, 90 onto the printed circuit board 100.

In assembly, the engaging portions 81, 91 of the first and second clips 80, 90 are located on the steps 11 of the heat absorbing board 10 and riveted to the heat absorbing board 10. Before being riveted, the engaging portions 81, 91 and the heat absorbing board 10 can be soldered together, thereby further insuring a secure connection therebetween. The fastening plates 633 of the first and second centrifugal fans 60, 70 are riveted to the corresponding locking portions 83, 93 of the first and second clips 80, 90 respectively. The riveting connections between the first and second centrifugal fans 60, 70 and the first and second clips 80, 90 can increase a strength of the whole heat dissipation device, thereby to avoid a deformation during an assembly of the heat dissipation device onto the printed circuit board 100 or a transportation thereof. The condensing sections 43 of the first and second heat pipes 40, 50 are inserted into the first and second heat sinks 20, 30 respectively. The evaporating sections 41 of the first and second heat pipes 40, 50 are attached onto the top of the heat absorbing board 10, and the first and second heat sinks 20, 30 are respectively located at the outlets 601 of the first and second centrifugal fans 60, 70. When the heat dissipation device is in use, the fasteners 99 are locked onto the printed circuit board 100 to make the heat absorbing board 10 intimately contact the heat-generating component 101 mounted on the printed circuit board 100.

The clips 80, 90 of the heat dissipation device, replacing the mounting plate of the conventional heat dissipating device, can simplify the design and reduce a manufacturing cost thereof.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device dissipating heat generated by a heat-generating component mounted on a printed circuit board, comprising:
    a heat absorbing board with a bottom thereof attached to the heat-generating component;
    a heat sink;
    a heat pipe having two ends thereof respectively connecting the heat absorbing board and the heat sink;
    a centrifugal fan located at a lateral side of the heat sink; and
    a clip having an engaging portion fixed with the heat absorbing board, and two locking portions extending from two ends of the engaging portion and locked onto the printed circuit board to secure the heat absorbing board on the heat-generating component;
    wherein a plurality of apertures are defined in the engaging portion of the clip, and a plurality of studs are formed on the heat absorbing board engagingly received in the apertures for riveting the heat absorbing board and the engaging portion of the clip together.

2. The heat dissipation device as claimed in claim 1, wherein a top of the heat absorbing board is depressed to form a step, and the studs are formed on the step.

3. The heat dissipation device as claimed in claim 1, wherein the locking portions of the clip are bent from the engaging portion of the clip.

4. The heat dissipation device as claimed in claim 3, wherein the locking portions and the engaging portion of the clip are straight in shape.

5. The heat dissipation device as claimed in claim 1, wherein the centrifugal fan comprises a frame and an impeller rotatably received in the frame, and the frame comprises a base and a cover covering the base, and a fastening plate extends from the cover to connect with one of the locking portions of the clip.

6. The heat dissipation device as claimed in claim 5, wherein a plurality of pins are formed on the one of the locking portions of the clip and riveted to the fastening plate of the centrifugal fan.

7. The heat dissipation device as claimed in claim 5, further comprising an additional heat sink, an additional heat pipe connecting the heat absorbing board and the additional heat sink, an additional centrifugal fan located at a lateral side of the additional heat sink, and an additional clip having an engaging portion connecting with the heat absorbing board, and two locking portions, one of which connects with an additional fastening plate extending from the additional centrifugal fan.

8. The heat dissipation device as claimed in claim 7, wherein the engaging portion of the additional clip rivets with the heat absorbing board, and the one of the locking portions of the additional clip rivets with the additional fastening plate of the additional centrifugal fan.

9. The heat dissipation device as claimed in claim 7, wherein the locking portions of the additional clip are bent from the engaging portion of the additional clip, and the locking portions of the additional clip are L shape.

10. A heat dissipation device dissipating heat generated by a heat-generating component mounted on a printed circuit board, comprising:
    a heat absorbing board with a bottom thereof attached to the heat-generating component;
    two heat sinks;
    two heat pipes respectively connecting the heat absorbing board and the two heat sinks;
    two centrifugal fans each of which is located at a lateral side of a corresponding heat sink; and
    two clips each comprising an engaging portion riveting with the heat absorbing board and two locking portions extending from two ends of the engaging portion and locked onto the printed circuit board to thereby secure the heat absorbing board on the heat-generating component;
    wherein a fastening plate extends from each of the centrifugal fans to rivet with a corresponding locking portion of a corresponding clip.

11. The heat dissipation device as claimed in claim 10, wherein the locking portions of the each clip are bent from the engaging portion thereof, and the locking portions of one of the clips are straight, while the locking portions of another clip are L shape.

12. A heat dissipation device dissipating heat generated by a heat-generating component mounted on a printed circuit board, comprising:

- a heat absorbing board with a bottom thereof attached to the heat-generating component;
- two heat sinks;
- two heat pipes respectively connecting the heat absorbing board and the two heat sinks;
- two centrifugal fans each of which is located at a lateral side of a corresponding heat sink; and
- two clips each comprising an engaging portion riveting with the heat absorbing board and two locking portions extending from two ends of the engaging portion and locked onto the printed circuit board to thereby secure the heat absorbing board on the heat-generating component;
- wherein the locking portions of the each clip are bent from the engaging portion thereof, and the locking portions of one of the clips are straight, while the locking portions of another clip are L shape.

* * * * *